United States Patent [19]
Daberkoe

[11] Patent Number: 4,580,858
[45] Date of Patent: Apr. 8, 1986

[54] ALIGNMENT FIXTURE ASSEMBLY FOR SURFACE-MOUNT CONNECTORS

[75] Inventor: David P. Daberkoe, Downingtown, Pa.

[73] Assignee: System Development Corporation, Camarillo, Calif.

[21] Appl. No.: 732,048

[22] Filed: May 9, 1985

[51] Int. Cl.[4] .............................................. H05K 13/04
[52] U.S. Cl. ................................. 339/17 LC; 29/741; 29/760
[58] Field of Search ................... 339/17 LC, 108–110; 29/739, 740, 741, 760, 832, 834, 836, 837, 840, 758; 269/43, 903

[56] References Cited

U.S. PATENT DOCUMENTS 4,059,890 11/1977 Sherwood ............................ 29/760
4,134,632 1/1979 Lindberg et al. .............. 339/17 LC
4,488,581 12/1984 Stumpf et al. ........................ 29/741

*Primary Examiner*—Neil Abrams
*Attorney, Agent, or Firm*—Francis A. Varallo; Mervyn L. Young; Kevin R. Peterson

[57] ABSTRACT

The present disclosure describes an alignment fixture having particular application in surface-mount connector technology. The fixture utilizes a plurality of through-hole connector sections having pins which are retained in holes formed in a plate and which exhibit a predetermined positional tolerance. A plurality of surface-mount connector sections to be mounted adjacently on the edge of a printed circuit board are plugged into mating through-hole connector sections, and positioned with respect to conductive pads on the board surface. In effect, the above-mentioned positional tolerance has been transferred by the fixture to the surface-mount connector sections.

5 Claims, 2 Drawing Figures

20
24
14
26
26a
34
32a
32
16
30
28
28a
22
18
12

ALIGNMENT FIXTURE ASSEMBLY FOR SURFACE-MOUNT CONNECTORS

BACKGROUND OF THE INVENTION

Surface-mount assembly in which electronic devices are mounted on electrically conductive pads on the surface of printed circuit boards, has assumed increasing importance to equipment manufacturers. In contrast to the through-hole technology in which the leads of electronic devices, such as DIP's or connectors, are inserted and soldered within plated-holes in the board, surface-mount assembly offers increased circuit density and lower production costs. Additionally, the surface mounting of devices provides improved high frequency circuit operation and increased reliability.

The "DIN" two-piece electrical connector configuration, comprised of a plug and mating socket is widely used. In designing for such connectors, where one of the sections is mounted on the edge of a printed circuit board, the alignment of the respective plug and socket bodies must be within ±0.004 inch. When only one connector section is mounted on the printed circuit board edge, the board is allowed to "float" in the card rack card guides in which it is disposed, to permit the board connector half to mate with the remaining connector half mounted on a backplane. However, when two or more connectors are mounted on the board edge, even though the board is permitted to "float", the location of the connector sections on the board with respect to each other, must be kept within the ±0.004 inch tolerance limit. Obviously, the same criterion must be met by the mating sections on the backplane if the connector sections are to be joined to each other.

In the case of the through-hole "DIN" connectors, the pins of the connector section to be mounted on the edge of a printed circuit board are inserted into corresponding metal-plated holes in the board and are soldered in place. With surface-mount connectors, the pins of the connector do not enter holes in the board, but instead, contact respective electrically conductive pads on the board surface. Each pin extremity of the surface-mount connector is bent to form a "foot" which rests upon a corresponding pad on the board. The pin is then reflow soldered to the pad.

As to the positional tolerance mentioned hereinbefore, the pin locations of the through-hole connector, the corresponding hole locations in the board, and the drill locations on both the board and connector are readily specified and held within the desired tolerance by precision manufacturing equipment. It should be noted that the maximum pin dimensions of the through-hole connector are less than the diameter of the hole dimensions of the board. Theoretically, this could result in a misalignment of mating connector sections. In practice however, it has been found that the effect of many pins in a common array located both on and off center as to the board holes in random fashion, tends to be compensatory such that the body of the connector becomes aligned within the required ±0.004 inch. As to the presence of a plurality of connector sections on a board edge, all holes for all connectors are drilled with the same numerically controlled drilling machine, which has an accuracy of ±0.0002 inch, which then insures a like positional tolerance from one connector section to another.

When employing surface-mount connectors which do not have pins protruding through plated through holes in the board, the aforementioned combined effect of the pins in aligning the body of the connector is absent. Accordingly, when a plurality of surface-mount connector sections are attached to the board in the recommended mounting configuration, utilizing standard hardware, the possible misalignment of the connector sections with respect to each other is likely to greatly exceed the allowable ±0.004 inch.

What is desired is a means for insuring the positions of a plurality of surface-mount connector sections relative to each other in their attachment to an edge of a printed circuit board. Such positioning is essential to successful engagement with respective connector mating sections on a backplane. The present invention provides an alignment fixture assembly for quickly and accurately accomplishing the foregoing.

SUMMARY OF THE INVENTION

In accordance with the present invention, an alignment fixture assembly is provided which facilitates the application of surface-mount technology to multiple-edge connectors for printed circuit boards.

The fixture is comprised of a strip or plate, preferably drilled and cut from the same panel as that forming the backplane. Thus, the same drill datum employed to form the plurality of connector hole arrays in the backplane, also form like arrays in the fixture strip. A standard numerically computer-controlled drilling machine produces hole positional tolerance of ±0.0002 inch. A plurality of through-hole "DIN" connector sections are mounted on the fixture strip. As noted hereinbefore, a centering effect is experienced from the array of pins in the holes of the strip such that a positional tolerance of ±0.0002 inch is obtained from one connector section to the other on the alignment fixture.

The surface-mount "DIN" connector sections which are to be assembled on the edge of a printed circuit board are then plugged into the through-hole connector sections of the fixture. The fixture with the surface-mount connector pieces inserted in the through-hole connector pieces, is used as a guide to position the foot-like extremities of the surface-mount connector pins with respect to the corresponding printed circuit board pads. The fixture is then secured to the board. The fixture and printed circuit board assembly are then subjected to a reflow solder operation in which the pins are soldered to the pads. The fixture through-hole connector sections are then unplugged from the surface-mount pieces and the fixture is removed.

It is important to note that it is the positional tolerance between adjacent connector sections mounted on the edge of a printed circuit board which is the critical factor. Thus, the initial tolerance of ±0.0002 inch present between the through-hole connector sections mounted on the fixture strip has been effectively transferred to the surface-mount connector sections attached to the printed circuit board. Since this is well within the required ±0.004 inch requirement between adjacent connector sections, a successful engagement of the board with the backplane is assured.

Other features and advantages of the alignment fixture assembly of the present invention will become apprent in the detailed description which follows.

DESCRIPTION OF THE PREFERRED EMBODIMENT

Figure 1:
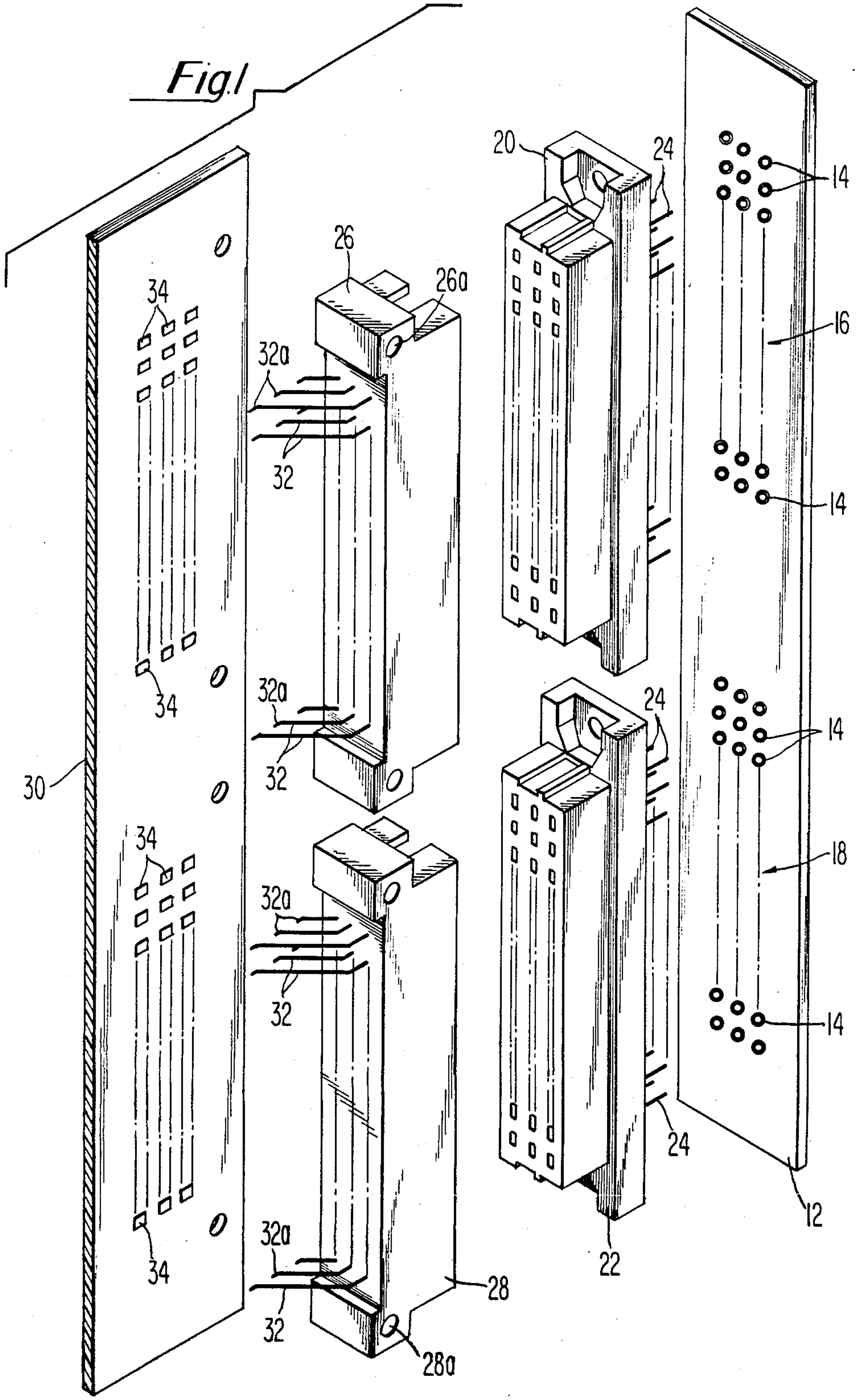
FIG. 1 is an exploded view of the alignment fixture assembly of the present invention.
Figure 2:
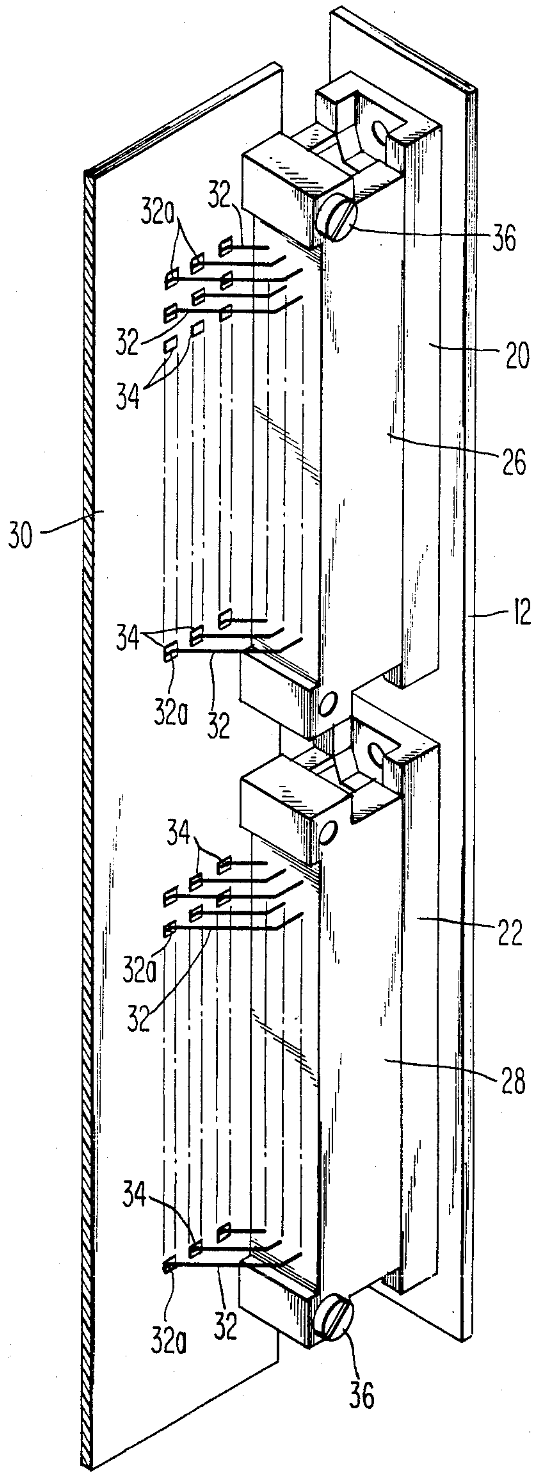
FIG. 2 is an assembled view of the fixture assembly as it appears during the soldering of the surface-mount connector leads to corresponding pads on a printed circuit board.

The fixture assembly 10 of the present invention is illustrated in exploded fashion in FIG. 1, and assembled in FIG. 2. With general reference to both FIGS. 1 and 2, and specific reference to individual figures where indicated, the fabrication and operation of the alignment fixture will be described in detail.

The fixture assembly 10 includes a strip or plate 12, generally formed of the same material as the system backplane panel (not shown). In fact, it is preferable, although not necessary, that the fixture plate 12 be formed from the backplane panel itself. Accordingly, the connector through-holes 14 present therein are drilled from the same datum as the backplane holes by a numerically, computer-controlled drilling machine. The plate 12 may then be cut from the backplane panel. The number of adjacent connector hole arrays, for example, 16 and 18, will be the same as corresponding arrays in the backplane. The hole positional tolerance of ±0.0002 inch in the hole arrays is a function of the precision drilling machine.

A pair of connector sections 20 and 22 of the through-hole type are mounted on the fixture plate 12—the pins 24 of connector sections 20 and 22 being inserted into plated-through holes 14 in the fixture plate 12 and being soldered therein. As noted hereinbefore, a centering effect will be experienced from the random positioning of the pins 24 in the holes 14 such that a positional tolerance of approximately ±0.0002 inch is readily achieved between adjacent connector sections 20 and 22 on the fixture plate 12.

As seen in FIG. 2, the surface-mount connector sections 26 and 28 to be mounted on the edge of the printed circuit board 30 are then plugged into the respective mating through-hole connector sections 20 and 22 mounted on plate 12. It should be observed, that the connection between the mating connector sections provides such a tight fit that exact positioning of the sections is maintained. Moreover, no movement of one section with respect to its mating section is experienced after they have been plugged together.

The fixture plate 12 with the surface-mount connector sections 26 and 28 installed, is then used as a guide to position the foot-like extremities 32*a* of the leads 32 upon corresponding pads 34 on the surface of the printed circuit board 30. Using standard mounting hardware 36 disposed in the outermost holes 26*a* and 28*a* of the surface-mount connector sections 26 and 28 respectively, the latter are secured to the board 30. The alignment fixture and printed circuit board, as an integral structure, is subjected to a reflow solder process to attach the surface-mount connector leads 32 to the printed circuit board pads 34. The board 30 is then unplugged from the through-hole connector sections 20 and 22 in the fixture plate 12.

In conclusion, it should be noted that the critical positioning (within ±0.004 inch) between adjacent surface-mount connector sections 26 and 28 is controlled by the alignment fixture, by virtue of mating through-hole connector sections 20 and 22 positioned within ±0.0002 inch of each other. It is a requirement of the present alignment fixture 10 that connector sections of the through-hole type be utilized on the fixture plate 12. Similarly, it is assumed that like connector sections will be employed on the backplane panel, although this is not a requirement for successful connector engagement. In effect, the present fixture assembly transfers the positional tolerance of the fixture plate to the surface-mount connector sections of the printed circuit board.

The alignment fixture assembly 10 described herein provides a convenient means of positioning a plurality of surface-mount connectors on the edge of a printed circuit board to ensure engagement with backplane connectors. The assembly eliminates the need for expensive measuring instruments and time consuming measurements to achieve the same results. It is apparent that depending upon the particular application, changes and modifications of the alignment fixture may be required. For example, while a pair of surface-mount connector sections 26 and 28 are illustrated as being mounted on the circuit board 30 in FIG. 2, a larger number may be required. Accordingly, the fixture plate 12 would contain a similar number of through-hole connector sections. Such changes and modifications, insofar as they are not departures from the true scope of the invention, are intended to be covered by the following claims.

What is claimed is:

1. An alignment fixture assembly for use in simultaneously mounted a plurality of surface-mount connector sections onto a printed circuit board comprising in combination:

a plurality of through-hole connector sections each having a plurality of pins, a plate having a plurality of adjacent arrays of holes formed therein and situated along a common longitudinal centerline, said arrays having a predetermined positional tolerance relative to each other, each of said arrays of holes retaining the plurality of pins of one of said through-hole connector sections whereby said positional tolerance is imparted to said last mentioned sections, a printed circuit board having a plurality of electrically conductive surface pads disposed in proximity to at least one edge of said board, a plurality of surface-mount connector sections each having a plurality of leads, said surface-mount connector sections being plugged into corresponding mating through-hole connector sections so that said surface-mount connector sections become aligned for subsequent mounting onto the surface of said printed circuit board, means for securing the plugged-in surface-mount connector sections to said printed circuit board, whereupon said leads of said surface-mount connector sections are affixed to said pads of said printed circuit board, thereby transferring said positional tolerance from said through-hole connector sections to said surface-mount connector sections, and permitting the disengagement of the respective pluralities of through-hole and surface-mount connector sections.

2. An alignment fixture assembly as defined in claim 1 wherein said through-hole and surface-mount connector sections conform to the DIN system configuration.

3. An alignment fixture assembly as defined in claim 2 wherein said means for securing said surface-mount connector sections to said printed circuit board includes screw-type fastener means, each of said through-hole connector sections and said printed circuit board having respective corresponding mounting holes, said fastener means being disposed in at least a pair of mounting holes adjacent respective opposite extremities of said plate.

4. An alignment fixture assembly as defined in claim 3 wherein said plate is a strip-like section of electrically insulative material, said holes formed therein being of the metallic plated-through variety, whereby said pins of said through-hole connector sections are retained in said holes by soldering.

5. An alignment fixture assembly as defined in claim 4 further characterized in that said predetermined positional tolerance is ±0.0002 inch.

* * * * *